(12) United States Patent
Menzies et al.

(10) Patent No.: US 9,666,968 B2
(45) Date of Patent: May 30, 2017

(54) ELECTRICAL BUSBAR, ELECTRICAL CONNECTOR ASSEMBLY AND POWER CONVERTER

(71) Applicant: Lear Corporation, Southfield, MI (US)

(72) Inventors: David Menzies, Linden, MI (US); Yu Qin, Troy, MI (US); Richard J. Hampo, Plymouth, MI (US)

(73) Assignee: Lear Corporation, Southfield, MI (US)

( * ) Notice: Subject to any disclaimer, the term of this patent is extended or adjusted under 35 U.S.C. 154(b) by 1048 days.

(21) Appl. No.: 13/743,662

(22) Filed: Jan. 17, 2013

(65) Prior Publication Data

US 2014/0198475 A1    Jul. 17, 2014

(51) Int. Cl.
*H01R 13/08* (2006.01)
*H05K 5/00* (2006.01)
*H05K 7/14* (2006.01)

(52) U.S. Cl.
CPC .......... *H01R 13/08* (2013.01); *H05K 5/0091* (2013.01); *H05K 7/1432* (2013.01)

(58) Field of Classification Search
CPC . H02M 7/003; H05K 7/1492; H01R 13/6625; H01R 25/162
See application file for complete search history.

(56) References Cited

U.S. PATENT DOCUMENTS

| | | | |
|---|---|---|---|
| 5,017,859 A * | 5/1991 | Engel | ..................... G01R 15/16 324/126 |
| 5,831,425 A | 11/1998 | Ochiai | |
| 6,552,273 B2 | 4/2003 | Nishida | |
| 7,205,757 B2 | 4/2007 | Itoh et al. | |
| 7,491,097 B2 * | 2/2009 | Ishihara | ............... G01R 15/207 324/117 H |
| 7,656,674 B2 * | 2/2010 | Wetzel | ................ F16H 61/0006 361/752 |

(Continued)

FOREIGN PATENT DOCUMENTS

CN      1897380 A    1/2007
CN    101188379 A    5/2008

(Continued)

OTHER PUBLICATIONS

Chinese Office Action for corresponding Application No. 20140019226.6, mailed Aug. 5, 2015, 10 pages.

(Continued)

*Primary Examiner* — Robert J Hoffberg
*Assistant Examiner* — Hung Dang
(74) *Attorney, Agent, or Firm* — Brooks Kushman P.C.

(57) ABSTRACT

An electrical connector assembly is provided with an electrical busbar for conducting power. The busbar has a width, a length, and a thickness. The busbar has a first portion with a first length, and a second portion with a second length. The second portion is oriented at a non-zero angle relative to the first portion. A connector is mounted to the busbar. One of the width and the thickness is reduced for receipt of a sensor about the busbar. A power converter assembly is provided with a direct current bus capacitor and a power module oriented in a housing. A plurality of the electrical connector assemblies are each connected to at least one of the direct current bus capacitor and the power module.

12 Claims, 3 Drawing Sheets

(56) References Cited

U.S. PATENT DOCUMENTS

| | | | | |
|---|---|---|---|---|
| 2007/0279175 A1* | 12/2007 | Lin | ...................... | G01R 15/202 336/173 |
| 2009/0015992 A1* | 1/2009 | Nohara | ................. | H02M 5/271 361/624 |
| 2010/0045417 A1* | 2/2010 | Feng | .................... | G01R 15/183 336/173 |
| 2011/0050222 A1 | 3/2011 | Ueno et al. | | |

FOREIGN PATENT DOCUMENTS

| | | |
|---|---|---|
| CN | 101969013 A | 2/2011 |
| CN | 201789431 U | 4/2011 |
| CN | 202652079 U | 1/2013 |
| WO | 2011162241 A1 | 12/2011 |
| WO | 2012090667 A1 | 7/2012 |

OTHER PUBLICATIONS

Chinese Office Action and English translation for corresponding Application No. 201410019226.6, mailed Sep. 26, 2016, 20 pages.

* cited by examiner

ELECTRICAL BUSBAR, ELECTRICAL CONNECTOR ASSEMBLY AND POWER CONVERTER

TECHNICAL FIELD

Various embodiments relate to electrical busbars, electrical connector assemblies, and power converters.

BACKGROUND

Vehicle power converters, including direct current to alternating current (DC-AC) inverters, DC-DC inverters, and AC-DC converters, typically comprise discrete components bolted into a housing.

SUMMARY

According to at least one embodiment, an electrical connector assembly is provided with an electrical busbar for conducting power. The busbar has a width, a length, and a thickness. The busbar has a first portion with a first length, and a second portion with a second length. The second portion is oriented at a non-zero angle relative to the first portion. A connector is mounted to the busbar.

According to at least another embodiment, a power converter assembly is provided with a housing. A direct current bus capacitor is oriented in the housing. A power module is oriented in the housing. A plurality of electrical connector assemblies are each connected to at least one of the direct current bus capacitor and the power module. Each electrical connector assembly is provided with an electrical busbar for conducting power. Each busbar has a width, a length, and a thickness. Each busbar has a first portion with a first length, and a second portion with a second length. The second portion is oriented at a non-zero angle relative to the first portion. A connector is mounted to each busbar.

According to at least another embodiment, an electrical busbar is provided for conducting power. The busbar has a width, a length, and a thickness. One of the width and the thickness is reduced for receipt of a sensor about the busbar.

According to at least another embodiment, a power converter assembly is provided with a housing. A direct current bus capacitor is oriented in the housing. A power module is oriented in the housing. A plurality of electrical connector assemblies are each connected to at least one of the direct current bus capacitor and the power module. Each electrical connector assembly is provided with an electrical busbar for conducting power. Each busbar has a width, a length, and a thickness. One of the width and the thickness is reduced for receipt of a sensor about the busbar. A connector is mounted to each busbar.

According to at least another embodiment, a vehicle power converter assembly is provided with a housing. A direct current bus capacitor is oriented in the housing. A power module is oriented in the housing. A plurality of electrical busbars is provided for conducting power. Each busbar has a width, a length, and a thickness. Each busbar has a first portion with a first length, and a second portion with a second length. Each second portion is oriented at a non-zero angle relative to the first portion. One of the first and second portions is connected to at least one of the direct current bus capacitor and the power module. A plurality of connectors is each mounted to one of the plurality of busbars for connection external of the housing.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Vehicle power converters, such as power inverters for motor drives, typically consist of discrete components bolted into a housing. These components are connected by bus bars which conduct current from one component to another.

Figure 1:
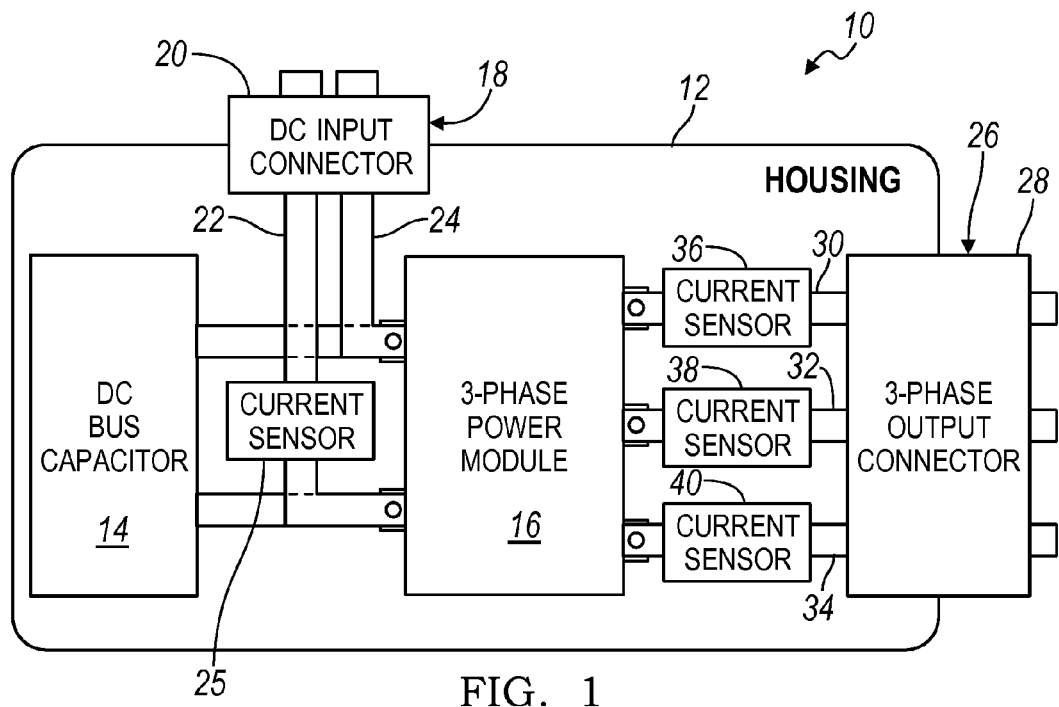
FIG. 1 is a schematic illustration of a power converter assembly according to at least one embodiment.

FIG. 1 illustrates a power converter assembly 10 according to an embodiment. The power converter assembly 10 includes a housing 12 that is adapted to be mounted to a vehicle chassis. A direct current (DC) bus capacitor 14 and a 3-phase power module 16 are mounted in the housing 12.

A DC input connector assembly 18 is provided with a connector 20 accessible external of the housing 12 for receiving an external input of DC power. The input connector assembly 18 includes a pair of busbars 22, 24, each connected to the capacitor 14 and the power module 16. The busbars 22, 24 provide a directed connection with the capacitor 14 and the power module 16 thereby eliminating parts, which consequently eliminates cost and assembly time. The elimination of parts reduces the number of fastened connections, thereby increasing reliability of the power converter assembly 10. Additionally, the busbars 22, 24 reduce power loss because each bolted joint has a measurable resistance, which causes a power loss. Further the reduction of parts enhances the compactness of the power converter assembly 10 while reducing weight. Compactness and lightweight are both factors that consequently improve efficiency or gas mileage of a vehicle. A current sensor 25 is also provided on the busbar 22.

A 3-phase output connector assembly 26 is provided with a connector 28 accessible external of the housing 12 for conveying an external output of 3-phase power. The output connector assembly 26 includes three busbars 30, 32, 34 each directly connected to the 3-phase power module 16. A current sensor 36, 38, 40 is provided on each of the busbars 30, 32, 34 of the output connector assembly 26. The busbars 30, 32, 34 provide the advantages discussed above associated with eliminating parts and power loss.

Power connectors typically have a large contact, such as a 14.5 mm blade terminal, that is formed from high-conductivity copper—which is also an ideal material for the busbars 22, 24, 30, 32, 34. Additionally, the current sensors 36, 38, 40 can be integrated, or mounted directly on the integral busbars 30, 32, 34, so that the current sensors 36, 38, 40 can be precisely calibrated to the busbars 30, 32, 34.

Figure 2:
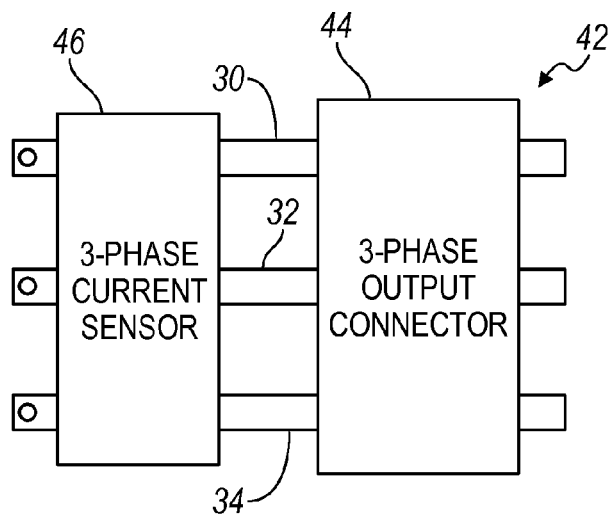
FIG. 2 is a schematic illustration of a connector assembly according to another embodiment.

FIG. 2 illustrates an electrical connector assembly 42 according to another embodiment which may be employed in the power converter assembly 10 of the prior embodiment. The electrical connector assembly 42 includes a connector 44 with the busbars 30, 32, 34. A 3-phase current sensor 46 is provided in cooperation upon all three busbars 30, 32, 34. The current sensor 46 reduces the number of components by replacing three separate current sensors, thereby providing fewer parts, lower cost, and higher reliability.

Figure 3:
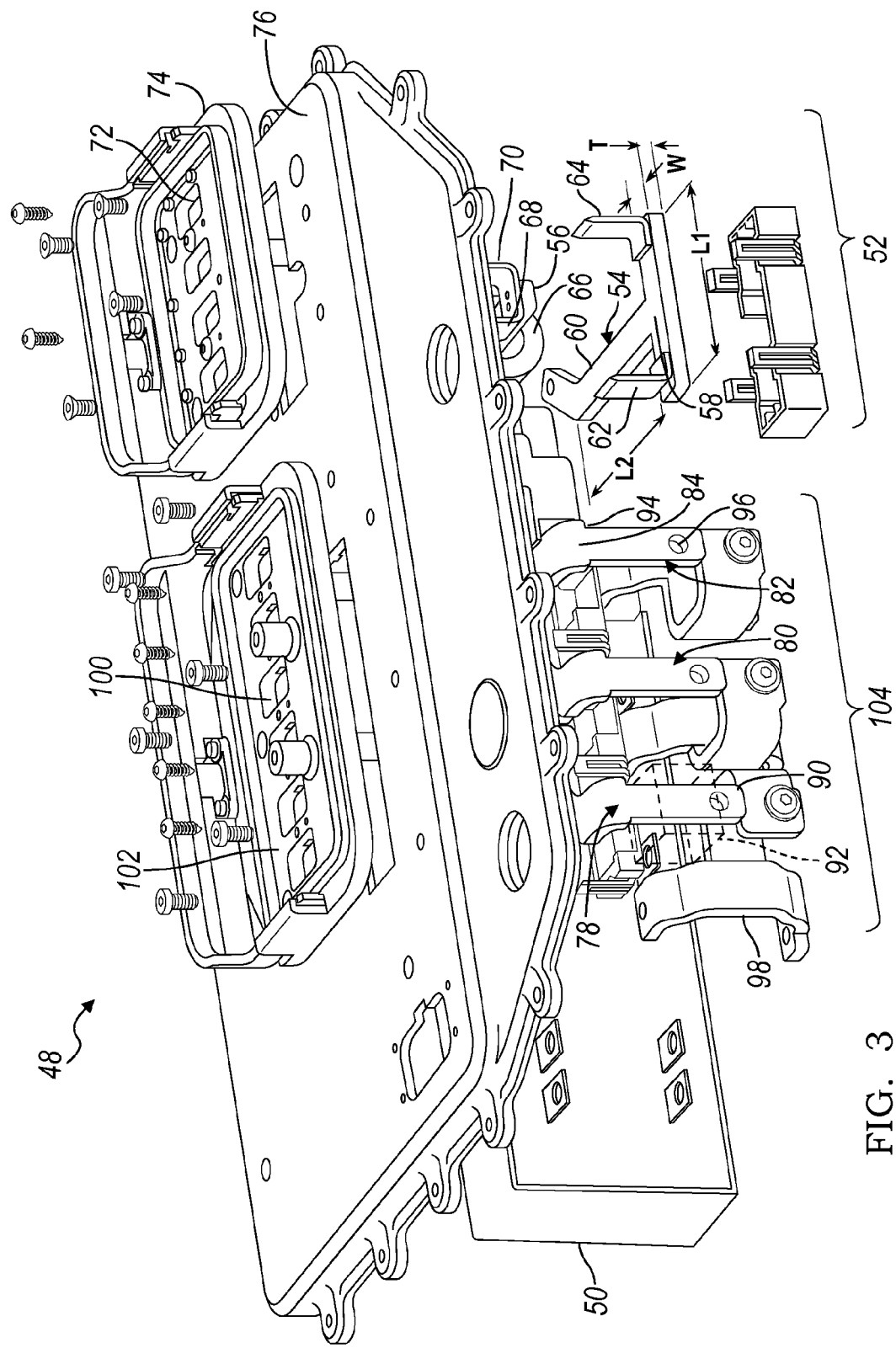
FIG. 3 is a partially exploded perspective view of a power converter assembly according to another embodiment.
Figure 4:
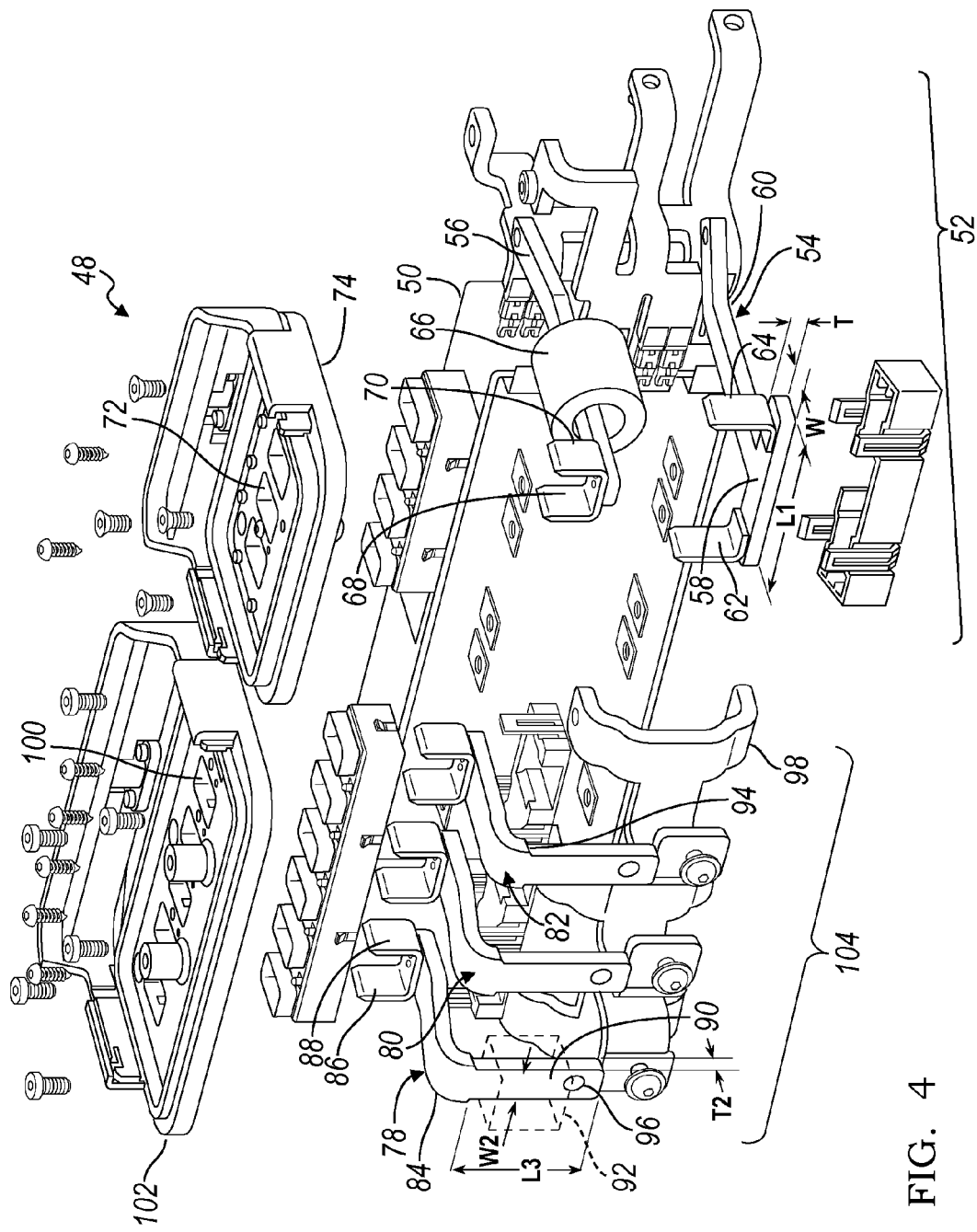
FIG. 4 is another partially exploded perspective view of the power converter assembly of FIG. 3.

FIGS. 3 and 4 illustrate a power converter assembly 48 according to another embodiment, which is depicted without a housing for revealing the internal components. A capacitor and power module 50 is provided within the housing. An input electrical connector assembly 52 includes a pair of busbars 54, 56.

Each busbar 54, 56 has a width W and a thickness T sized to maximize a cross-sectional area thereby minimizing resistance, and consequently minimizing power loss. The busbars 54, 56 each have a minimized overall length in order to minimize resistance. The busbar 54 has a first portion 58 with a length L1, and a second portion 60 with a length L2. The first and second portions 58, 60 are angled relative to each other, for example, at a ninety degree angle relative to each other. In contrast to the prior art, the first and second portions 58, 60 are at an angle to each other and are formed integrally to avoid a bolted connection.

A pair of male terminal blades 62, 64 are each provided on the first portion 58 of the busbar 54. The blades are formed generally parallel with the second portion 60. Each blade 62, 64 is formed integrally with the busbar 54 according to an embodiment. According to another embodiment, the blades 62, 64 are welded to the busbar 54 to avoid a bolted connection with a threaded fastener, which can otherwise increase resistance and may disassemble during travel.

The busbar 56 includes a filter 66 and a pair of male terminal blades 68, 70. The blades 62, 64, 68, 70 extend through apertures 72 in a header assembly 74 on a cover plate 76 of the housing. The header assembly 74 provides a connector interface for the input connector assembly 52. The electrical connector assembly 52 may include sensors as depicted in the prior embodiments. The connector assembly 52 may include a female portion formed integrally with the busbar 54.

The power converter assembly 48 also includes three busbars 78, 80, 82 for conveying the 3-phase power. Each busbar 78, 80, 82 has a first portion 84 with a pair of male terminal blades 86, 88. Each busbar 78, 80, 82 has a second portion 90 with a width W2, a length L3, and a thickness T2. The width W2 is reduced to receive a current sensor 92. The reduced width W2 provides a pair of abutment surfaces 94 for locating the sensor 92. The abutment surfaces 94 provide accurate positioning of the current sensor 92 for reliability and minimizing calibration of the sensor 92. Additionally the sensor 92 is sized to receive the busbar 78, thereby avoiding a threaded fastener.

Additionally an aperture 96 is formed in the second portion 90 of each busbar 78, 80, 82 to electrically connect the busbars 78, 80, 82 to a collector 98. The blades 86, 88 of the busbars 78, 80, 82 collectively extend through apertures 100 in a header assembly 102 on the cover plate 76. The header assembly 102 provides a connector interface for an output connector assembly 104.

While various embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An electrical connector assembly comprising:
    an electrical busbar for conducting power, the busbar having a width, a length, and a thickness, the busbar having a first portion with a first length, and a second portion with a second length, the second portion oriented generally perpendicular to the first portion; and
    a connector mounted to the busbar;
    wherein the connector is mounted to the first portion;
    wherein the electrical connector assembly further comprises a sensor mounted to the second portion;
    wherein the second portion is formed with an abutment surface spaced apart from the first portion for locating the sensor; and
    wherein the sensor comprises a current sensor.

2. The electrical connector assembly of claim 1 wherein the connector is formed integrally with the busbar.

3. The electrical connector assembly of claim 1 wherein the connector is welded to the busbar.

4. The electrical connector assembly of claim 1 wherein the connector is not fastened to the busbar by a threaded fastener.

5. The electrical connector assembly of claim 1 wherein the connector comprises at least one blade.

6. The electrical connector assembly of claim 1 wherein the connector comprises a female portion formed integrally with the busbar.

7. The electrical connector assembly of claim 1 wherein an aperture is formed into the second portion of the busbar to receive a fastener to electrically connect the busbar to another electrical component.

8. The electrical connector assembly of claim 1 wherein the sensor is not fastened to the busbar by a threaded fastener.

9. A power converter assembly comprising:
    a housing;
    a power module oriented in the housing; and
    a plurality of electrical connector assemblies according to claim 1 each connected to the power module.

10. The electrical connector assembly of claim 1 wherein the second portion is formed with a pair of abutment surfaces spaced apart from the first portion to locate the sensor.

11. The electrical connector assembly of claim 5 wherein the at least one blade extends from the first portion in a direction that is generally parallel with a length of the second portion.

12. A power converter assembly comprising:
    a housing;
    a power module oriented in the housing;
    a plurality of electrical connector assemblies according to claim 7 each connected to the power module;
    a collector with a plurality of apertures in engagement with the second portion of each of the plurality of electrical connector assemblies; and
    a plurality of fasteners fastening the plurality of electrical connector assemblies to the collector.

* * * * *